United States Patent
Yap

(10) Patent No.: US 9,761,569 B2
(45) Date of Patent: Sep. 12, 2017

(54) LEADFRAME-BASED SYSTEM-IN-PACKAGES HAVING SIDEWALL-MOUNTED SURFACE MOUNT DEVICES AND METHODS FOR THE PRODUCTION THEREOF

(71) Applicant: FREESCALE SEMICONDUCTOR INC., Austin, TX (US)

(72) Inventor: Weng F. Yap, Chandler, AZ (US)

(73) Assignee: NSP USA, INC., Austin, TX (US)

(*) Notice: Subject to any disclaimer, the term of this patent is extended or adjusted under 35 U.S.C. 154(b) by 0 days.

(21) Appl. No.: 14/984,092

(22) Filed: Dec. 30, 2015

(65) Prior Publication Data

US 2016/0111403 A1    Apr. 21, 2016

Related U.S. Application Data

(62) Division of application No. 14/216,690, filed on Mar. 17, 2014, now Pat. No. 9,257,419.

(51) Int. Cl.
*H01L 23/495* (2006.01)
*H01L 25/16* (2006.01)
(Continued)

(52) U.S. Cl.
CPC ............ *H01L 25/16* (2013.01); *H01L 21/56* (2013.01); *H01L 21/561* (2013.01); *H01L 23/12* (2013.01); *H01L 23/3107* (2013.01); *H01L 23/49548* (2013.01); *H01L 23/49575* (2013.01); *H01L 23/49589* (2013.01); *H01L 23/5389* (2013.01); *H01L 24/19* (2013.01); *H01L 24/96* (2013.01); *H01L 24/97* (2013.01); *H01L 25/0657* (2013.01); *H01L 25/105* (2013.01); *H01L 25/165* (2013.01); *H05K 1/0284* (2013.01); *H05K 1/181* (2013.01); *H01L 21/568* (2013.01); *H01L 23/49816* (2013.01);
(Continued)

(58) Field of Classification Search
None
See application file for complete search history.

(56) References Cited

U.S. PATENT DOCUMENTS

2006/0049479 A1* 3/2006 Pearson ................. H01L 23/50
257/516
2009/0106564 A1* 4/2009 Qu ........................... G06F 1/26
713/300

(Continued)

OTHER PUBLICATIONS https://www.polymersolutions.com/blog/conductive-inks-making-their-mark/; "Conductive Inks Making Their Mark", Polymer Solutions, Apr. 8, 2014.

*Primary Examiner* — Shaun Campbell

(57) ABSTRACT

Embodiments of a method for fabricating System-in-Packages (SiPs) are provided, as are embodiments of a SiP. In one embodiment, the method includes producing a first package including a first molded package body having a sidewall. A first leadframe is embedded within the first molded package body and having a first leadframe lead exposed through the sidewall. In certain implementations, a semiconductor die may also be encapsulated within the first molded package body. A Surface Mount Device (SMD) is mounted to the sidewall of the first molded package body such that a first terminal of the SMD is in ohmic contact with the first leadframe lead exposed through the sidewall.

20 Claims, 7 Drawing Sheets

(51) Int. Cl.
  *H01L 23/12*   (2006.01)
  *H01L 23/00*   (2006.01)
  *H05K 1/18*   (2006.01)
  *H05K 1/02*   (2006.01)
  *H01L 21/56*   (2006.01)
  *H01L 23/538*   (2006.01)
  *H01L 25/10*   (2006.01)
  *H01L 23/31*   (2006.01)
  *H01L 25/065*   (2006.01)
  *H01L 25/18*   (2006.01)
  *H01L 23/498*   (2006.01)

(52) U.S. Cl.
  CPC ............. *H01L 24/32* (2013.01); *H01L 24/48* (2013.01); *H01L 24/73* (2013.01); *H01L 25/18* (2013.01); *H01L 2224/12105* (2013.01); *H01L 2224/24175* (2013.01); *H01L 2224/32245* (2013.01); *H01L 2224/48091* (2013.01); *H01L 2224/48247* (2013.01); *H01L 2224/73265* (2013.01); *H01L 2224/97* (2013.01); *H01L 2225/0651* (2013.01); *H01L 2225/06572* (2013.01); *H01L 2225/06582* (2013.01); *H01L 2225/107* (2013.01); *H01L 2225/1029* (2013.01); *H01L 2225/1035* (2013.01); *H01L 2225/1064* (2013.01); *H01L 2924/00014* (2013.01); *H01L 2924/1203* (2013.01); *H01L 2924/1205* (2013.01); *H01L 2924/1206* (2013.01); *H01L 2924/1207* (2013.01); *H01L 2924/12042* (2013.01); *H01L 2924/181* (2013.01); *H05K 2201/1003* (2013.01); *H05K 2201/10015* (2013.01); *H05K 2201/10022* (2013.01); *H05K 2201/10174* (2013.01); *Y10T 29/41* (2015.01); *Y10T 29/49126* (2015.01); *Y10T 29/49139* (2015.01)

(56) References Cited

U.S. PATENT DOCUMENTS

2009/0206458 A1*  8/2009  Andrews, Jr. ....... H01L 23/3121
                                                    257/676
2010/0053010 A1*  3/2010  Shtrom ................. H01Q 9/285
                                                    343/749

* cited by examiner

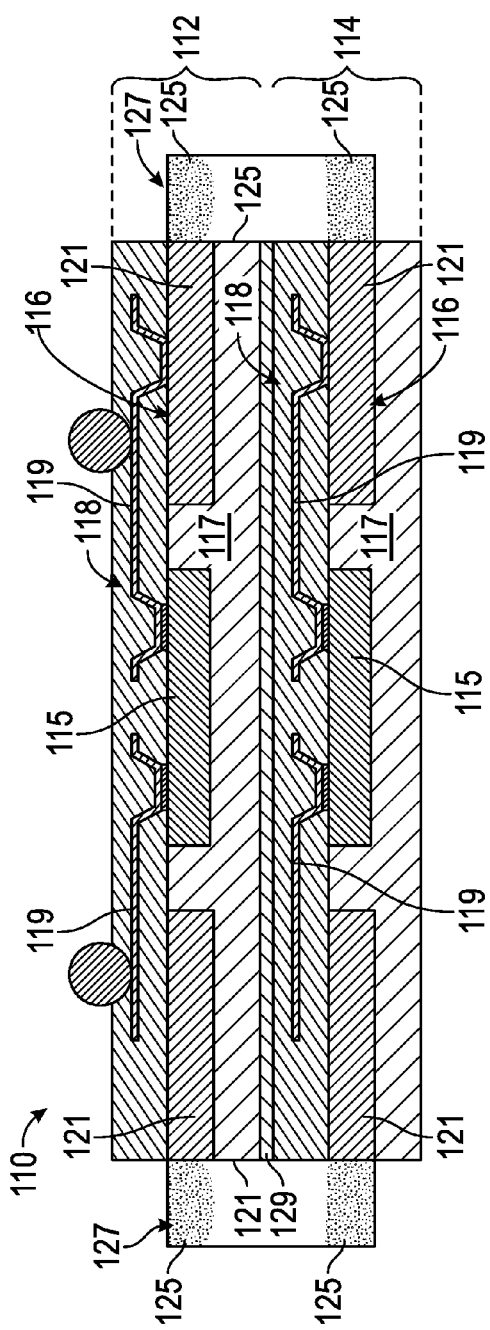
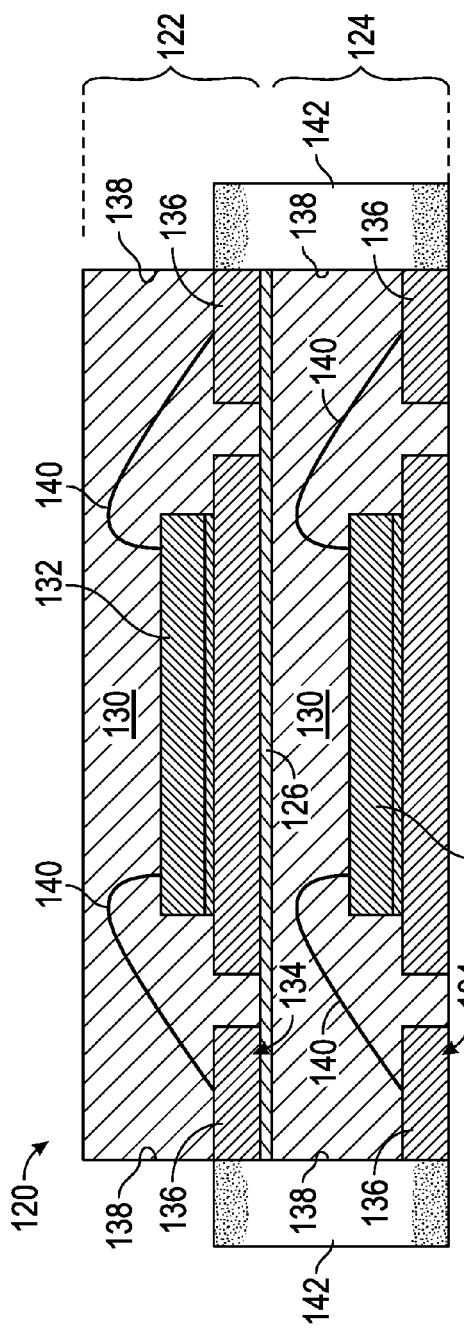
FIG. 14
FIG. 15

LEADFRAME-BASED SYSTEM-IN-PACKAGES HAVING SIDEWALL-MOUNTED SURFACE MOUNT DEVICES AND METHODS FOR THE PRODUCTION THEREOF

CROSS-REFERENCE TO RELATED APPLICATION

This application is a divisional of co-pending U.S. application Ser. No. 14/216,690, filed Mar. 17, 2014.

TECHNICAL FIELD

Embodiments of the present invention relate generally to microelectronic packaging and, more particularly, to leadframe-based System-in-Packages (SiPs) and methods for fabricating leadframe-based SiPs including sidewall-mounted surface mount devices.

BACKGROUND

Leadframes are commonly incorporated into different types of microelectronic packages including, for example, leaded packages (e.g., Dual Flat Packages/"DFPs" and Quad Flat Packages/"QFPs") and no-lead packages (e.g., Dual-Flat No-Lead/"DFN" packages and Quad-Flat No-Lead/"QFN" packages). In the case of leaded packages, the leadframe typically includes elongated leads, such as gull-wing leads, projecting outwardly and downwardly from the package sidewalls to permit surface mounting to an electronic device or substrate, such as a Printed Circuit Board ("PCB"). Conversely, in the case of no-lead packages, portions of the leadframe may be exposed through the package bottomside to permit surface mounting to a PCB. During manufacture of the microelectronic package, the semiconductor die can be placed onto the leadframe die flags utilizing a pick-and-place tool; the bond pads of the die can be electrically interconnected with the leadframe by, for example, wire bonding; and the die, the body of the leadframe, and the wire bonds can then be overmolded with an encapsulant to complete fabrication of the microelectronic package.

BRIEF DESCRIPTION OF THE DRAWINGS

At least one example of the present invention will hereinafter be described in conjunction with the following figures, wherein like numerals denote like elements, and:

FIG. 14 is a cross-sectional view of SiP including two FO-WLPs bonded in a front-to-back configuration, as illustrated in accordance with a still further exemplary embodiment of the present invention; and FIG. 15 is a cross-sectional view of SiP including two Flat No-Lead packages bonded in a front-to-back configuration, as illustrated in accordance with yet another exemplary embodiment of the present invention.

Figure 1:
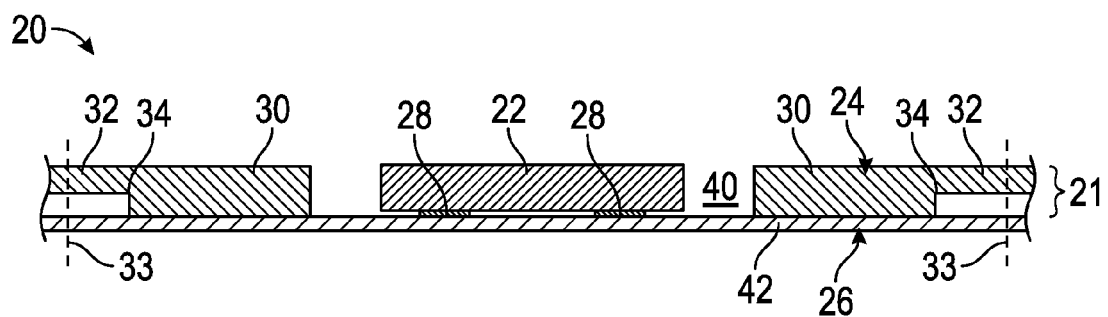
FIG. 1 is a cross-sectional view of a partially-completed Fan-Out Wafer Level Package ("FO-WLP"), which can be incorporated into a larger SiP in accordance with an exemplary embodiment of the present invention.

For simplicity and clarity of illustration, the drawing figures illustrate the general manner of construction, and descriptions and details of well-known features and techniques can be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures can be exaggerated relative to other elements or regions to improve understanding of embodiments of the invention.

DETAILED DESCRIPTION

Leadframe-based System-in-Packages (SiPs) and a method for producing leadframe-based SiPs including sidewall-mounted Surface Mount Devices are provided; the term "Surface Mount Device" and the corresponding acronym "SMD" utilized herein in reference to a discrete microelectronic device directly mountable on the surface of a substrate, such as a PCB, having electrical points-of-contact with which the SMD can be placed in ohmic contact. In certain embodiments, the SiP can include a single microelectronic package, while, in other embodiments, the SiP can include two or more packages bonded in a stacked or Package-on-Package (PoP) configuration. In either case, the SiP will include at least one package having a molded or encapsulated package body in which a leadframe is embedded. The leadframe includes at least one lead, which extends laterally to a sidewall of the molded package body and is exposed therethrough. One or more SMDs are bonded to the package sidewall(s) such that the SMDs are placed in ohmic contact with the leadframe leads exposed through the sidewall(s). The SMDs may assume the form of discrete resistors, capacitors, inductors, diodes, and the like.

While it may be possible to interconnect the leadframe leads utilizing another type of sidewall conductor, such as an electrically-conductive printed trace, the usage of sidewall-mounted SMDs enables the production of highly robust sidewall interconnections and allows multiple SMDs to be incorporated into the SiP in a compact manner. Additionally, by mounting one or more SMDs to the sidewalls of the package, additional space that might otherwise be occupied by the SMDs can be made available on the package topside and/or bottomside for the provision of a larger contact array, a larger heat sink, or other such structure. As a still further benefit, SMDs of various types are commercially available at low cost and can be soldered directly to the leadframe leads without the provision of an Organic Solderability Preservation (OSP) coating. The end result is a highly compact SiP, which can be produced in an efficient and cost effective manner.

Embodiments of the fabrication method described herein can be utilized to produce SiPs containing a single package, multiple stacked packages of the same type, or multiple stacked packages of different types. In preferred embodiments, the SiP includes at least one FO-WLP and/or at least one Flat No Lead package, such as a DFN or QFN package. In the latter case, the SiP can be considered a Flat No Lead package while containing a number of leadframe leads internal to the package. In embodiments wherein the SiP includes at least one FO-WLP and/or at least one Flat No-Lead package, the package or packages included within the SiP can be produced via encapsulation of a semiconductor die and a leadframe in a molded panel along with a number of other semiconductor die and leadframes. In this case, the leadframes can be interconnected as a panel-sized leadframe assembly, and the die can be positioned within openings provided in the leadframes. The molded panel can be singulated to separate the partially-completed SiPs, sever the leadframe assembly into individual leadframes, and create discrete molded package bodies (the singulated pieces of the panel) having sidewalls through which the leadframe leads are exposed. The term "exposed through," as appearing herein, denotes that the leadframe leads extend to and can be substantially coplanar with the package sidewall(s) to allow ohmic contact with the sidewall-mounted SMDs. The term "exposed through" thus does not denote that the leadframe leads are visible or visually exposed from exterior of the completed SiP. Indeed, when the SiP packages are completed, the leadframe leads will typically not be visually exposed from the exterior of the completed SiP as the leads can be largely or wholly covered by the sidewall-mounted SMDs. An example of this process will now be described below in conjunction with FIGS. 1-11.

FIGS. 1 and 4-9 are cross-sectional views of a SiP 20, as illustrated at various stages of manufacture and shown in accordance with an exemplary embodiment of the present invention. When completed, SiP 20 contains two microelectronic packages, namely, a first FO-WLP 21 (shown in FIGS. 1 and 4-11) and a second FO-WLP 23 (shown in FIGS. 7-10). Prior to singulation of the molded panel, the panel containing FO-WLP 21 can be stacked with the panel containing FO-WLP 23 and both panels can be singulated utilizing a single dicing process. After singulation, SMDs can then be mounted to one or more sidewalls of SiP 20 (and the other SiPs produced via singulation of the panel stack) to complete the fabrication process, as described below in conjunction with FIGS. 9-11.

Referring initially to FIG. 1, production of FO-WLP 21 can generally commence with the placement of a number of semiconductor die and leadframes on a temporary substrate 26 (partially shown). FO-WLP 21 may be referred to herein as the "upper" package with reference to the illustrated orientation of SiP 20 and with the understanding that SiP 20 can assume any orientation in three dimensional space. While a single semiconductor die 22 and a single leadframe 24 are placed on the illustrated portion of temporary substrate 26 (corresponding to upper FO-WLP 21), it will be appreciated that other semiconductor die and leadframes are distributed across the non-illustrated portions of substrate 26. When placed onto temporary substrate 26, semiconductor die 22 is inverted and positioned facedown such that bond pads 28 of die 22 are placed in contact with the upper surface of substrate 26. Leadframe 24 includes a leadframe body 30, which can extend around the periphery die 22 and possibly serve as an Embedded Ground Plane (EGP) in the completed FO-WLP 21. When viewed from a top-down perspective, leadframe body 30 can have a generally rectangular planform shape, which defines a central opening 40 in which die 22 is positioned. Additional microelectronic components, such as a second die or one or more SMDs, can also be placed within opening 40 in further embodiments.

Figure 2:
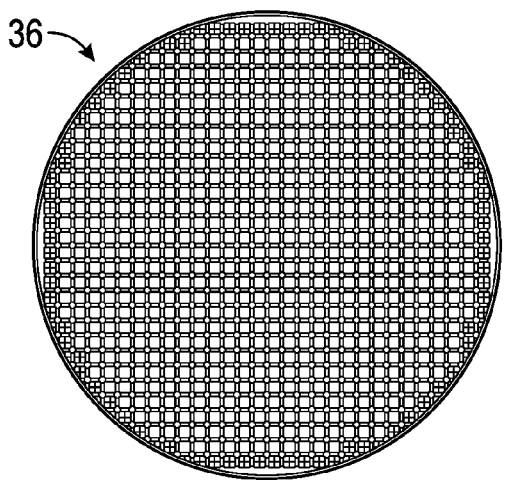
FIGS. 2 and 3 are top-down and isometric views, respectively, of leadframe assembly in which the leadframe shown in FIG. 1 can be included.
Figure 3:
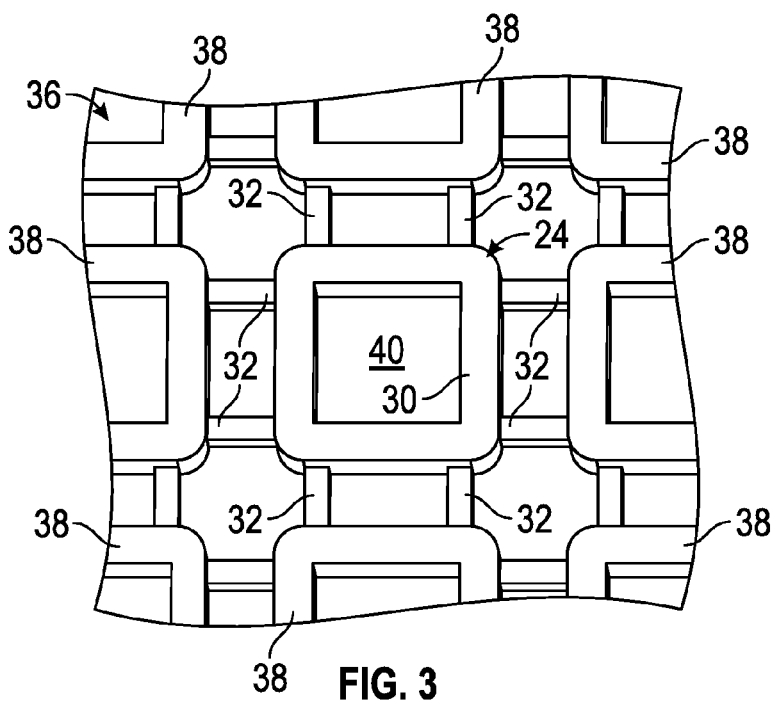

Leadframe 24 further includes a number of leads 32, which each extend laterally outward from leadframe body 30 in a direction away from semiconductor die 22 and toward a peripheral edge of FO-WLP 21. Leadframe leads 32 each include an outer sacrificial portion, which is removed during the below-described singulation process. In particular, the terminal end portions of leads 32 residing within the saw lines (partially identified in FIG. 1 by dashed lines 33) are cut away during singulation. To minimize wear of the saw blade, leadframe leads 32 can be imparted with a reduced thickness as compared to leadframe body 30. For example, leadframe leads 32 can be produced to each include a half-etch feature 34 wherein the thickness of leads 32 decreases or steps-down when moving toward the periphery of FO-WLP 21. To facilitate manufacture of FO-WLP 21 and the other FO-WLPs, leadframe 24 can be interconnected with the other non-illustrated leadframes as a panel-size leadframe assembly. In this regard, FIG. 2 provides a top-down view of an exemplary leadframe assembly 36 in which leadframe 24 can be included. Also, FIG. 3 illustrates in greater detail the region of leadframe assembly 36 including leadframe 24. As can be seen, leads 32 of leadframe 24 are attached (e.g., integrally formed within) the leads of a number of surrounding leadframes 38 to form leadframe assembly 36. Leadframe 24 and the other leadframes 38 are later separated by severing the conjoined portions of the leads during the panel singulation process described below in conjunction with FIG. 8.

Temporary substrate 26 (FIG. 1) can be any body, structure, or platform suitable for supporting semiconductor die 22, leadframe 24, and the other non-illustrated die and leadframes during panel encapsulation (also commonly referred to as "panelization" or "overmolding"). In one embodiment, temporary substrate 26 is a taped molded frame, which includes an adhesive layer 42 (identified in FIG. 1) on which semiconductor die 22 and leadframe 24 are placed. A non-illustrated mold frame, which has a central cavity or opening therein, is positioned over adhesive layer 42 and around the semiconductor die disposed thereon. An electrically-insulative encapsulant or mold compound, such as a silica-filled epoxy, is dispensed into the cavity of the mold frame. The encapsulant flows over and around die 22, leadframe 24, and the other die/leadframes placed on tape layer 42. The encapsulant can then be cured (e.g., by heating in a partially-evacuated chamber) to yield a solid panel in which die 22, leadframe 24, and the other non-illustrated die/leadframes are embedded. The panel can be produced as a relatively thin body or mass having any desired shape and dimensions. In other embodiments, the panel can be produced utilizing various other known fabrication techniques including, for example, compression molding and lamination processes.

Figure 4:
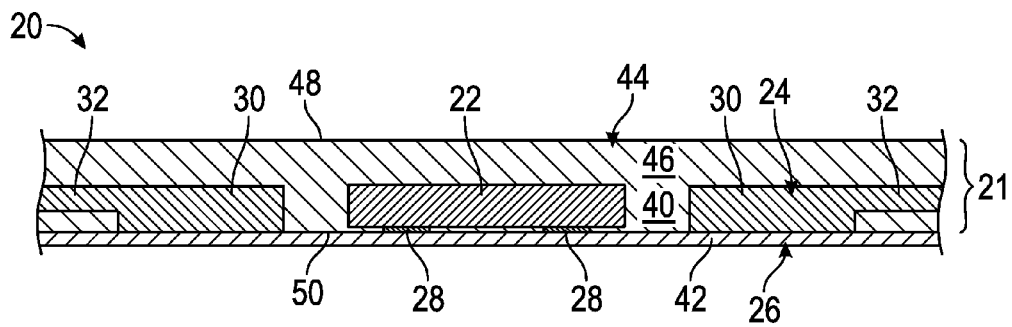
FIGS. 4-11 are cross-sectional views of an SiP including the FO-WLP shown in FIG. 1, as illustrated at various stages of completion and shown in accordance with an exemplary embodiment of the present invention.
Figure 5:
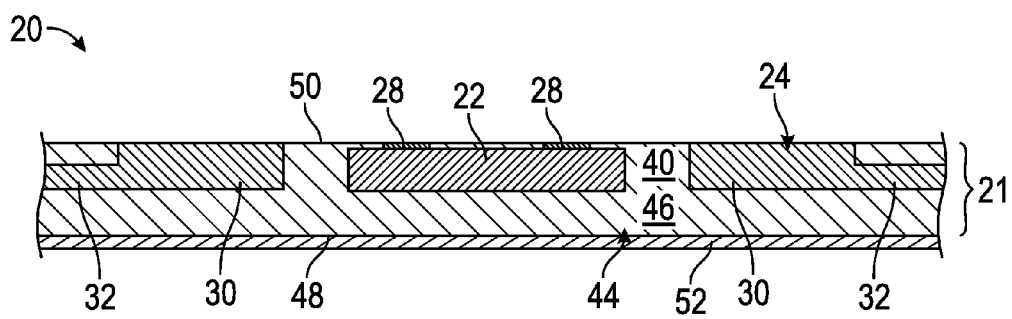

FIG. 4 illustrates a portion of a molded panel 44, which can be produced pursuant to the above-described encapsulation process and which encompasses FO-WLP 21. While only the portion of molded panel 44 corresponding to partially-completed FO-WLP 21 is shown for clarity, it will be understood that molded panel 44 will typically be considerably larger than the illustrated portion and can contain various other encapsulated die and leadframes of the type described above. Molded panel 44 includes a panel body 46 having a backside surface 48 and an opposing frontside surface 50 (the upper and lower principal surfaces, respectively, in the inverted orientation shown in FIG. 4). Molded panel 44 can be thermally released or otherwise removed from temporary substrate 26 to reveal frontside 50 of panel body 46. Bond pads 28 of semiconductor die 22 are exposed through frontside 50 of molded panel 44 when removed from temporary substrate 26, as shown in FIG. 5. Leadframe 24 is also at least partially exposed through panel frontside 50 to permit electrical interconnection between bond pads 28 and leadframe leads 32, as further described below. In certain embodiments, the upper principal surface of leadframe 24 can be substantially coplanar with the frontside of die 22 on which bond pads 28 are disposed, as generally shown in FIG. 5.

Additional processing of molded panel 44 can be performed after release from substrate 26. For example molded panel 44 can be cleaned to remove any adhesive residue present thereon, further curing of panel 44 can be performed by oven bake, and so on. Molded panel 44 can then be inverted and attached to a support structure, such as a ceramic carrier 52 shown in FIG. 5. With frontside 50 of panel 44 now facing upwards, one or more frontside redistribution layers (also commonly referred to as "build-up layers" or "metal levels") can be built over panel 44 and, therefore, over semiconductor die 22 and leadframe 24.

Figure 6:
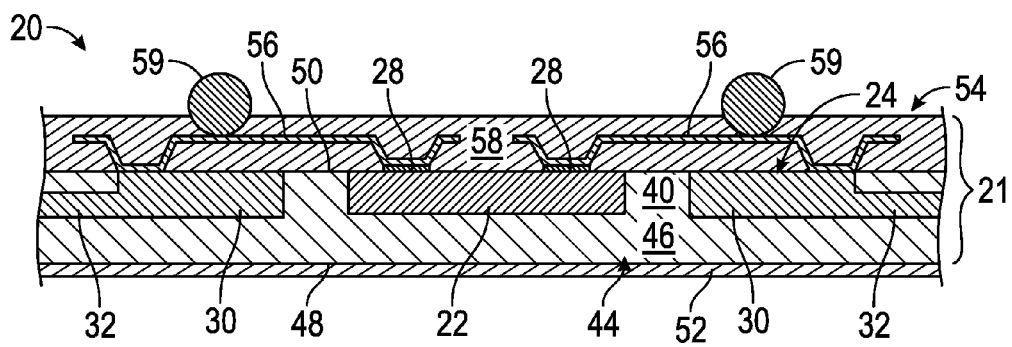

As shown in FIG. 6, a number of frontside redistribution layers 54 are produced over frontside 50 of panel 44 and include a network of interconnect lines 56 disposed within a body of dielectric material 58. Dielectric body 58 can be formed as a number of successively-deposited (e.g., spun-on) dielectric layers, while interconnect lines 56 can be formed within dielectric body 58 utilizing well-known lithographical patterning and conductive material (e.g., copper) deposition techniques. For example, each metal level can be produced by patterning a mask layer deposited over a seed layer, plating exposed regions of the seed layer with copper or another metal, and then removing the mask layer to define the desired electrically-conductive features. Interconnect lines 56 can comprise various metal traces, vias, metal plugs, and/or the like, which collectively provide electrically-conductive paths between the upper surface of frontside redistribution layers 54 and semiconductor die 22. Additionally, interconnect lines 56 can electrically interconnect semiconductor die 22 and leadframe leads 32. In this regard, interconnect lines 56 can be formed in ohmic contact bond pads 28 of die 22 and one or more regions of leadframe 24 exposed through frontside 50 of molded panel 44.

After formation of frontside redistribution layers 54, trenches or openings can be formed in the uppermost redistribution layer (e.g., a solder mask layer) by lithographical patterning to expose selected regions of interconnect lines 56. A frontside contact array can then be produced over the frontside of partially-completed SiP 20 and in ohmic contact with the exposed regions of interconnect lines 56. For example, as shown in FIG. 6, the frontside contact array can be produced as a first BGA including a plurality of solder balls 59 deposited into the openings formed in the outermost RDL dielectric layer and in ohmic contact with frontside interconnect lines 56. In further embodiments, the frontside contact array (and the other contact arrays described herein) can assume various other forms suitable for providing externally-accessible points-of-contact to the interconnect lines embedded within redistribution layers 54.

Figure 7:
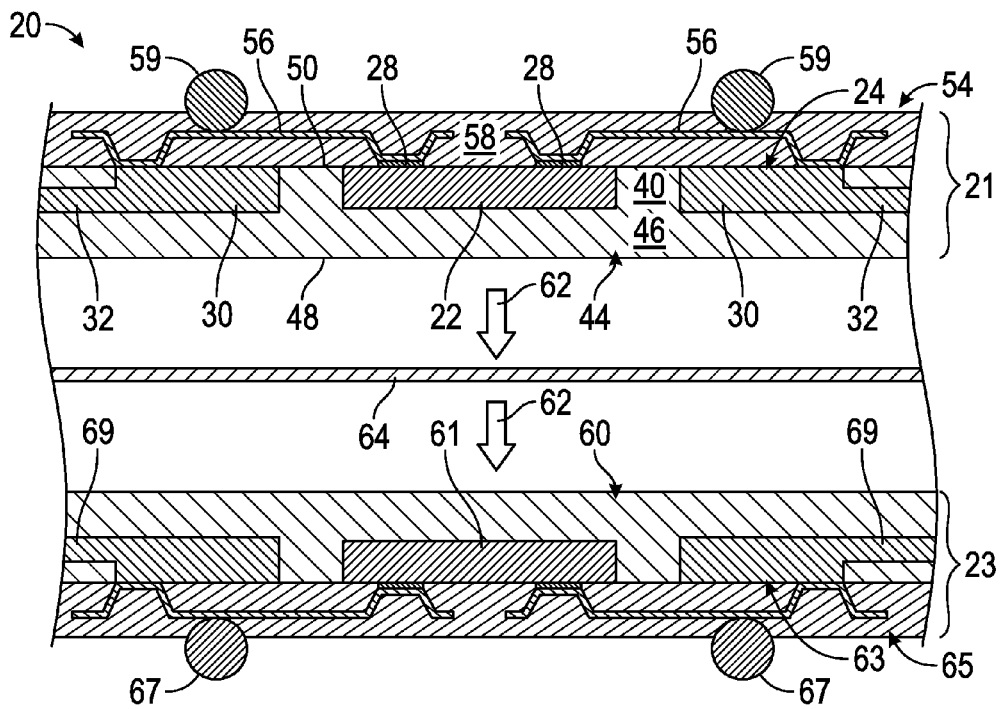

Turning to FIG. 7, molded panel 44 containing upper FO-WLP 21 can now be stacked with a second molded panel 60 containing lower FO-WLP 23. For ease of explanation, lower FO-WLP 23 is shown having similar components to upper FO-WLP 21 in the illustrated example shown in FIG. 7 (e.g., as does FO-WLP 21, FO-WLP 23 may include a semiconductor die 61 and a leadframe 63 embedded within molded panel 60 over which a number of backside redistribution layers 65 and a backside BGA 67 are produced). As was previously the case, leadframe 63 includes a number of leadframe leads 69, which project laterally away from die 61. However, in contrast to FO-WLP 21, FO-WLP 23 is inverted such that the frontside of panel 60 is facing in a downward direction. As indicated in FIG. 7 by arrows 62, the respective backsides of panels 44 and 60 can be bonded or laminated together to produce a back-to-back or mold-to-mold panel stack 44, 46. Alternatively, as discussed below in conjunction with FIG. 14, panels 44 and 60 can be bonded in a front-to-back or mold-to-redistribution layer configuration. An intervening adhesive layer 64 can be utilized to bond panels 44 and 46. Adhesive layer 64 is preferably a thermally-curable epoxy or die attach material, but may be composed of any material or materials suitable for bonding panels 44 and 46 including, for example, double-sided tape.

Figure 8:
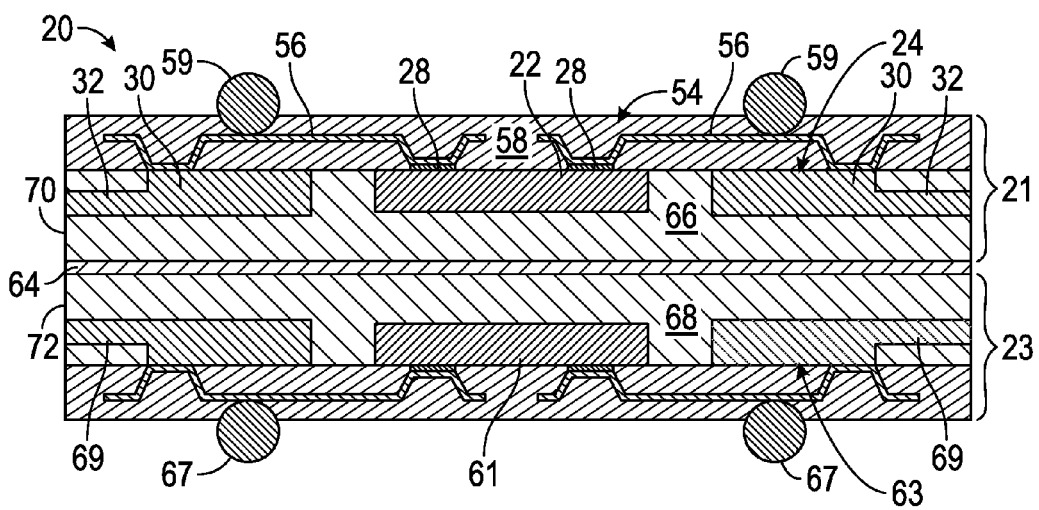

Panel stack 44, 46 is now singulated to separate SiP 20 and the other SiPs into discrete packages. The other SiPs produced in parallel with SiP 20 may or may not be substantially identical to SiP 20; however, the process steps described herein will typically be performed globally across the molded panels and are consequently generally descriptive of the processing of the panels, as a whole. Singulation is conveniently carried-out utilizing a dicing saw; however, other singulation processes can also be utilized including, for example, laser cutting. FIG. 8 illustrates SiP 20 after singulation of panel stack 44, 46. Hereafter, the singulated piece of panel 44 included within upper FO-WLP 21 is identified by reference numeral "66" and referred to as a "molded package body." Similarly, the singulated piece of panel 60 included within lower FO-WLP 23 is identified by reference numeral "68" and is likewise referred to as a "molded package body" hereafter. Singulation imparts upper and lower package bodies 66 and 68 with substantially vertical sidewalls 70 and 72, respectively. Sidewalls 70 and 72 of upper and lower package bodies 66 and 68 generally align or are flush to impart SiP 20 with a generally a rectangular planform geometry. Leadframe leads 32 of upper package layer 21 extend to, are exposed through, and can be substantially coplanar with sidewalls 70 of upper package body 66. So too are leadframe leads 69 of lower package layer 23 exposed through sidewalls 72 of lower package body 68. Singulation of the panel stack thus exposes leadframe leads 32 and 69 through the sidewalls 70 and 72 of upper and lower package bodies 66 and 68, respectively; and, more generally, through the sidewalls of SiP 20. In one embodiment, each leadframe lead 32, 69 can have a surface or face exposed through a package sidewall, which is substantially coplanar therewith and which has a width exceeding about 50 µm. While it is preferred that singulation of molded panels 44 and 60 is performed after panel stacking for manufacturing efficiency, the possibly that panel 44 and/or panel 60 can be singulated prior to package-on-package or package-on-panel stacking is by no means precluded.

Figure 9:
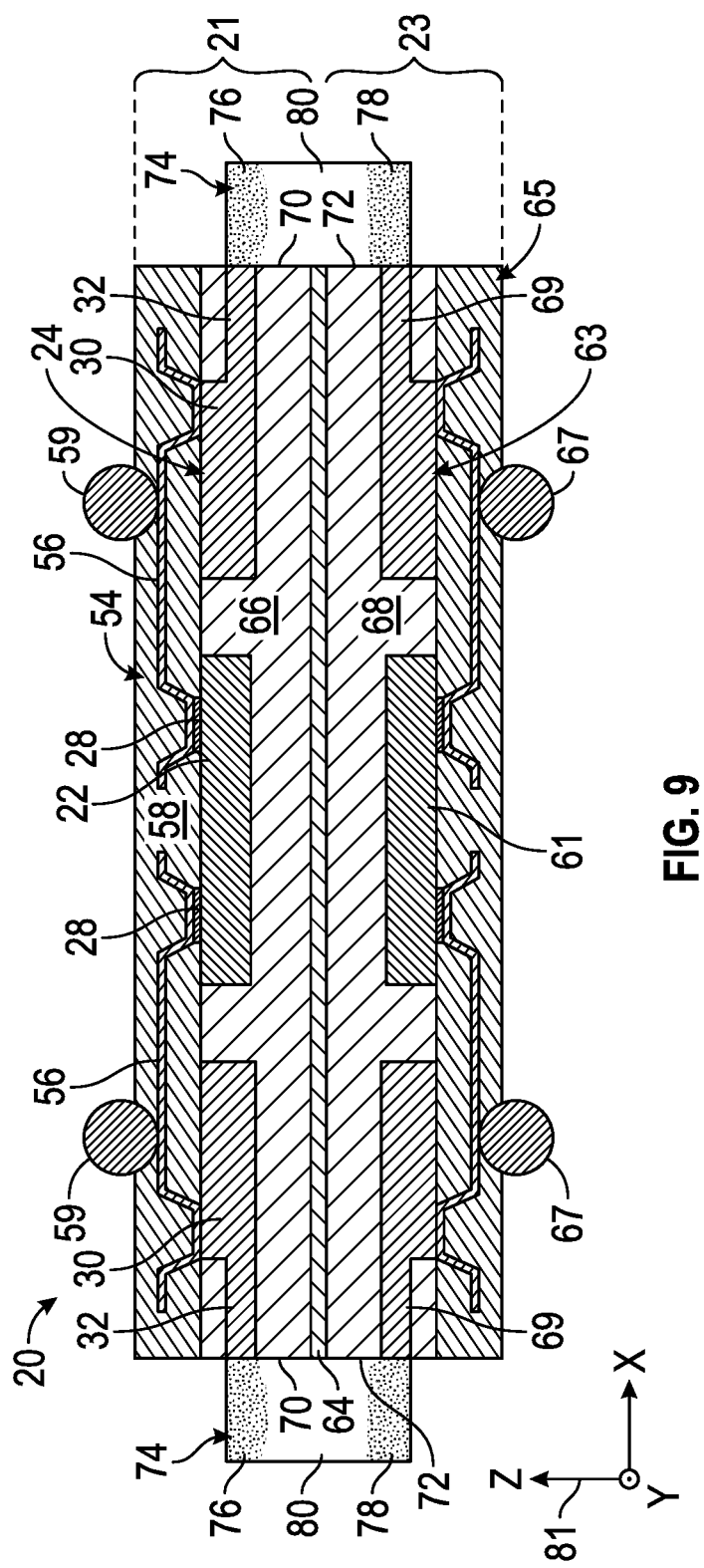

With reference to FIG. 9, Surface Mount Devices (SMDs) 74 are next mounted to the sidewalls of SiP 20 such that the terminals of SMDs 74 are coupled to and, preferably, placed in ohmic contact with the leadframe leads 32 and 69 exposed through the package sidewalls. The sidewall-mounted SMD 74 can be utilized to provide their traditional or intended function, such as the provision of a known resistance, capacitance, inductance, or the like. Additionally or alternatively, the sidewall-mounted SMDs 74 can also provide a non-traditional function, namely, the provision of low (e.g., about 011) resistance signal paths between leadframe leads contained within the same package or different packages. For example, in instances wherein it is desired to provide a low resistance signal communication path between leadframe leads 32 and 69, one or more of SMDs 74 may assume the form of discrete 0 ohm resistors. As appearing herein, the term "about 0 ohm (Ω)" is defined herein as a resistance of less than 0.1Ω; and the term "0 ohm resistor" is defined as a resistor having a resistance of less than 0.1Ω. In certain cases, a single SMD can be utilized to provide both of these functionalities.

SMDs 74 may be placed in their desired position utilizing, for example, a pick-and-place tool. Soldering may then be performed to electrically couple and mechanically attach the terminals of SMDs 74 to leadframe leads 32. If desired, SiP 20 may be placed on its die or a specialized fixture may be utilized to retain SMDs 74 in their desired position during the solder process.

In the illustrated example, SMDs 74 are two terminal devices each having a generally rectangular body 80, when viewed from the side, top, or bottom; and which is flanked by electrically-conductive end terminals 76 and 78. SMDs 74 can be, for example, discrete resistors, capacitors, inductors, diodes, or any combination thereof. In one embodiment, SMDs 74 can assume the form of discrete capacitors (commonly referred to as "chip capacitors" or, more simply, "chip caps") each including an electrically-insulative (e.g., ceramic) body 80 disposed between two electrically-conductive end pieces. In other embodiments, one or more of SMDs 74 can assume the form of a two-terminal chip inductor or a two-terminal chip resistor having the generally rectangular form factor illustrated in FIG. 9. The SMD terminals can be composed of any electrically-conductive material and can have various different surface finishes, such as tin, copper, gold, nickel, conductive epoxy, palladium, silver, and lead-based finishes, to list but a few examples.

Figure 10:
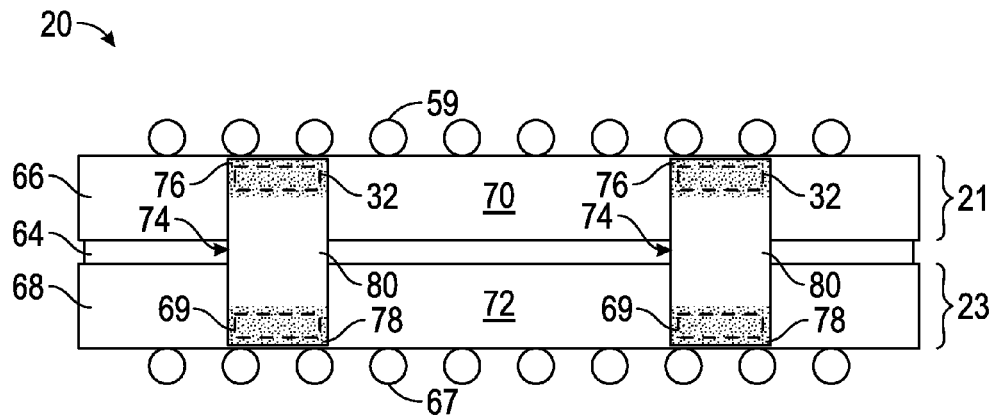
Figure 11:
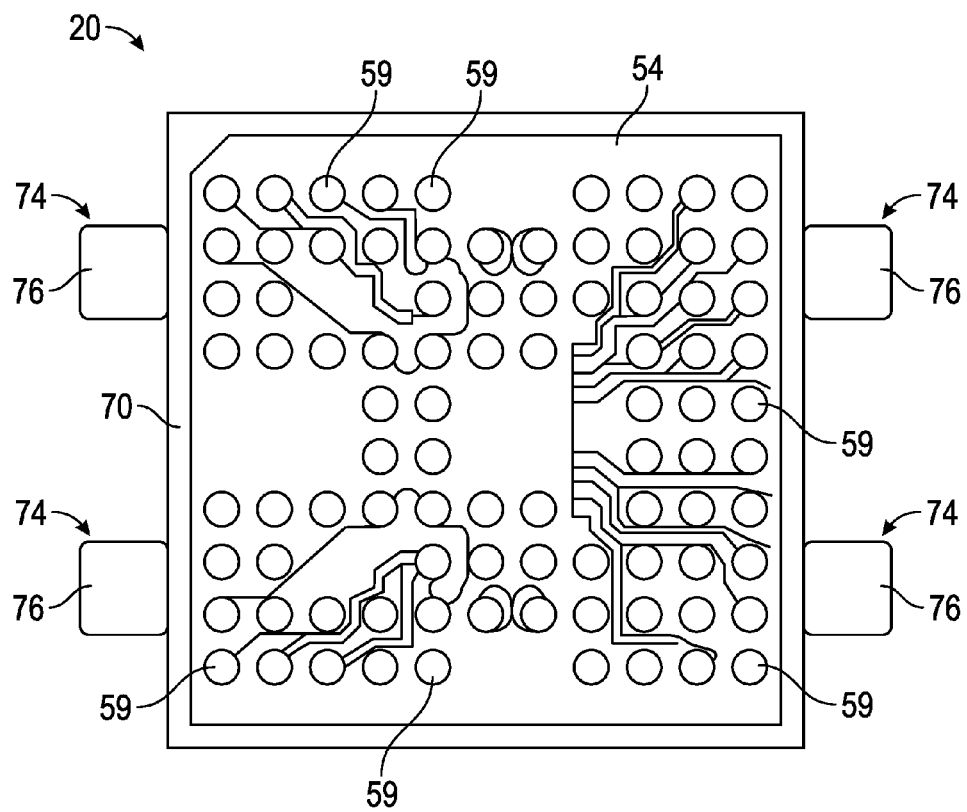

FIGS. 10 and 11 further illustrate SiP 20 from side and top-down views, respectively. In FIG. 10, respective leadframe leads 32 and 69 of upper and lower FO-WLPs 21 and 23 are shown in phantom. Referring collectively to FIGS. 9-11, SMDs 74 are mounted to two sidewalls of SiP 20 in the illustrate example; however, SMDs 74 can be mounted to one, three, or more sidewalls of SiP 20 in further embodiments. Furthermore, while two SMDs 74 are mounted to each sidewall in the illustrated example, any number of SMDs can be mounted to each sidewall. On a package level, each SMD 74 is mounted to a sidewall 66 of upper FO-WLP 21, as well as to a sidewall 72 of lower FOWLP package 23. Each SMD 74 is electrically coupled between a different pair of leadframe leads 32, 69 included within packages 21 and 23. In particular, the terminals 76 and 78 of each SMD 74 can be soldered to different leadframe leads 32, 69, which are exposed through sidewalls 26 prior to attachment of SMDs 74. In this manner, each SMD 74 can provide a known resistance, inductance, or capacitance between selected leadframe leads 32, 69 included within the stacked FO-WLPs 21 and 23. In further embodiments, a discrete resistor having a resistance of about 0Ω and can be utilized as one or more SMDs 74 to provide a low resistance signal path between selected pairs of leadframe leads 32, 69 included within packages 21 and 23. Each SMD 74 can interconnect different overlying or vertically-aligning pairs of leadframe leads 32 in an embodiment (with each lead 32, 69 contained in a different package layer and generally aligning along an axis substantially orthogonal to the upper principal or lower principal surface, identified as the Z-axis by coordinate legend 81 in FIG. 9). This example notwithstanding, the leadframe leads 32 interconnected by a given SMD 74 need not precisely align or vertically-overlap in all embodiments.

By incorporating sidewall-mounted SMDs 74 into SiP 20 in the above-described manner, several benefits are achieved. First, mounting SMDs 74 to one or more sidewalls 26 of SiP 20 can help to free additional space on the package topside or bottomside (on which SMDs are more commonly mounted) for the provision of one or more contact arrays, such as BGAs 66 and 70 shown in FIGS. 1-3. Second, as indicated above, mounting SMDs 74 to the sidewalls 26 of SiP 20 allows SMDs 74 to provide their traditional functional (e.g., the provision of known resistance, capacitance, or inductance), while also potentially providing low resistance interconnections between peripheral leadframe portions or leads contained within the same or different package layers. Notably, it can be possible to interconnect the peripheral leadframe portions utilizing a non-SMD sidewall interconnect, such as printed ink trace containing electrically-conductive nanoparticles. However, use of printed sidewall conductors can be limited to the production of relatively thin traces (width <10 μm) and can require the provision of OSP coating. In contrast, solder attachment of SMDs 74 generally do not require such a coating and can provide relatively wide (width >50 μm) electrically-conductors, which also provide superior mechanical strength. Furthermore, SMDs having dimensions suitable for incorporation into SiPs of the type described herein are readily available as Commercial Off The Shelf (COTS) components.

Figure 12:
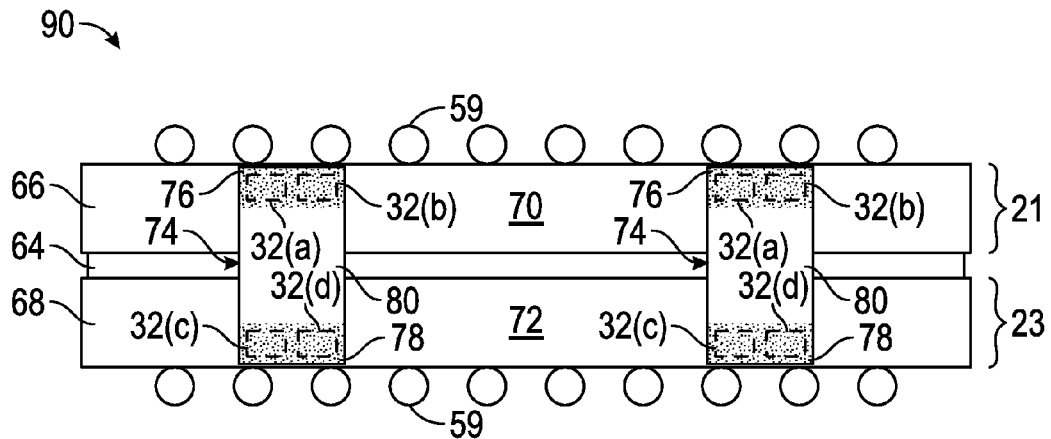
FIGS. 12 and 13 are side views of a SiP including a plurality of sidewall-mounted SMDs, as illustrated in accordance with still further exemplary embodiments of the present invention.

In the embodiment shown in FIGS. 9-11, each SMD terminal was soldered to or otherwise placed in ohmic contact with a single leadframe lead 32, 69. In further embodiments, multiple leadframe leads 32, 69 can be ohmically coupled to a single SMD terminal. To further emphasize this point, FIG. 12 is a side view of a SiP 90 that is substantially identical to SiP 20 (like reference numerals denoting like structure elements) with the following exception: multiple leadframe leads 32 are coupled to each terminal of the illustrated SMDs 74. In particular, for each SMD 74, two leadframe leads 32(a) and 32(b) included within upper FO-WLP 21 are electrically coupled to SMD terminal 76, while two leadframe leads 32(c) and 32(d) included within lower FO-WLP 23 are electrically coupled to the opposing SMD terminal 78. Such a configuration allows SMDs 74 to provide low resistance interconnections between leadframe leads, while also providing a known capacitance, inductance, or resistance between multiple different pairs of leads. With respect to the embodiment shown in FIG. 12, specifically, SMD terminal 76 provides a low resistance interconnection between leadframe leads 32(a) and 32(b), and SMD terminal 78 provides a low resistance interconnection between leadframe leads 32(c) and 32(d). At the same time, each SMD 74 provide a known capacitance, inductance, or resistance between lead 32(a) and either of leads 32(c) and 32(d); as well as between lead 32(b) and either of leads 32(c) and 32(d).

Figure 13:
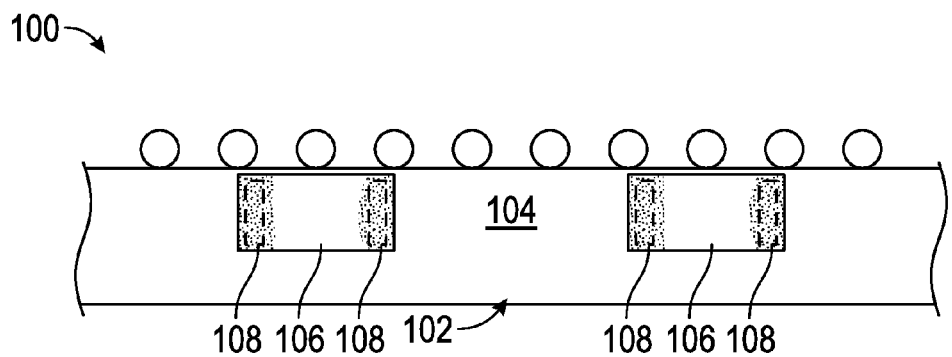

In the embodiments shown in FIGS. 9-12, SMDs 74 are placed in a vertical orientation; that is, such that the longitudinal axis of each SMD 74 is substantially orthogonal to the plane bounding the upper or lower principal surfaces of SiP 20 (FIGS. 9-11) or SiP 90 (FIG. 12). In further embodiments, some or all of SMDs 74 are placed in horizontal orientation, such that the longitudinal axis of each SMD is substantially parallel to the plane bounding the upper or lower principal surfaces of SiP 20. Consider, for example, FIG. 13 illustrating a single-package or single-layer SiP 100 including a molded package body 102 having a substantially vertical sidewall 104. Two SMDs 106 are mounted to package sidewall 104, each in a horizontal orientation. The opposing terminals of each SMD 106 are electrically coupled to and, preferably, placed in ohmic contact with leadframe leads 108 (shown in phantom) exposed through package sidewall 104. In this manner, multiple SMDs 106 can be incorporated into single-package SiP 100 in a space efficient manner, while providing a known capacitance, inductance, resistance, or the like between leads 108 within the same package. If desired, additional SMDs 106 can be mounted to one or more of the non-illustrated sides of SiP 100.

In further embodiments, SiP 100 can include two or more packages in a stacked or PoP configuration, one or more SMDs mounted in a vertical orientation and electrically interconnecting leadframe leads in the same or different package layers, and one or more SMDs mounted in a horizontal orientation and likewise electrically interconnecting leadframe leads in the same or different package layers. In embodiments wherein the SiP includes at least one vertically-oriented SMD, the length of the SMD will typically be less than the height of the SiP package (see, for example, SiP 20 shown in FIGS. 9-11 and SiP 90 shown in FIG. 12). Similarly, in embodiments wherein the SiP includes at least one horizontally-oriented SMD, the width of the SMD will typically be less than the height of the SiP package (see, for example, SiP 100 shown in FIG. 13).

In the exemplary embodiment described above in conjunction with FIGS. 9-11, upper and lower FO-WLPs 21 and 23 are bonded or laminated in a back-to-back or mold-to-mold configuration. In further embodiments, two or more FO-WLPs can be bonded in a front-to-back or mold-to-redistribution layer configuration to produce the completed SiP. Further illustrating this point, FIG. 14 is a cross-sectional view of a SiP 110 including upper and lower FO-WLPs 112 and 114. FO-WLPs 112 and 114 are similar to packages 21 and 23, respectively, shown in FIGS. 9-11. For example, FO-WLPs 112 and 114 each include a die 115 and a leadframe 116 embedded within a molded package body 117. One or more redistribution layers 118 are formed over the frontside of package body 117 and contain interconnect lines 119, which electrically coupled die 115 to leadframe 116. Each leadframe 116 includes a number of laterally-projecting leads 121, which extend to the sidewalls 123 of the package bodies to contact the terminals 125 of sidewall-mounted SMDs 127. However, in contrast to packages 21 and 23 shown in FIGS. 9-11, lower FO-WLP 114 is laminated to upper FO-WLP 112 in an upright or non-inverted position such that uppermost redistribution layer 54 of package 114 is bonded to molded body 66 of package 112 by an adhesive layer 129 (e.g., a layer of die attach material). In this case, the semiconductor die 22 embedded within lower FO-WLP 112 is electrically coupled to frontside BGA 59 through lower interconnect lines 56, through lower leadframe 24, through sidewall-mounted SMDs 74, through upper leadframe 24, and through upper interconnect lines 56. While not shown in FIG. 14 to avoid cluttering the drawing, it is also possible to provide electrical connection across the package-to-package interface to, for example, permit interconnection between lower interconnect lines and upper leadframe 24 and/or one or more through mold vias formed through molded package body 66 of upper FO-WLP 110.

The exemplary SiPs described above contain a particular type of microelectronic package (namely, one or more FO-WLPs). It is emphasized, however, that embodiments of the SiPs described herein can include packages of various types as appropriate to the application, providing that the SiP includes at least one package having a molded package body in which a leadframe is embedded having a leadframe lead or peripheral portion, which extends to a sidewall of the package body and which is electrically coupled to at least one SMD mounted thereto. For example, in further embodiments, the SiP can include one or more packages produced utilizing a Flat No Lead process, such as a sawn QFN strip level stacking process. FIG. 15 is a cross-sectional view of a SiP 120 including two Flat No-Lead packages 122 and 124, which are laminated by an intervening bonding layer 126. Package 122 and 124 each include a molded package body 130 containing at least one semiconductor die 132 and a leadframe 134. As was the case previously, each leadframe 134 includes at least one leadframe lead 136 that extends to and is exposed through a sidewall 138 of the molded package body 130. Wire bonds 140 electrically interconnect the packaged die 132 with their corresponding leadframe leads 136. One or more SMDs 142 are mounted to the sidewalls of SiP 120 and electrically interconnect different pairs of leadframe leads 136 included within packages 122 and 124. SMDs 142 can provide their traditional function (e.g., the provision of a known resistance, capacitance, or inductance) and/or the provision of a low resistance electrical interconnection between neighboring leads 136 in the same or different package layers. The above-described advantages are thus obtained by virtue of this package architecture including, amongst other benefits, the provision of a compact SiP having structurally robust sidewall interconnections not requiring the usage of an OSP coating material.

There has thus been provided embodiments of a method for producing leadframe-based SiPs including sidewall-mounted SMDs. As described above, the sidewall-mounted SMDs can be a passive two terminal devices, such as discrete resistors, capacitors, inductors, and/or diodes. In certain embodiments, the SiP can include a single microelectronic package; while, in other embodiments, the SiP can include two or more packages bonded in a stacked or PoP configuration. In either case, the SiP includes at least one package having a molded body in which a leadframe is embedded. The leadframe includes, in turn, one or more leads exposed through one or more sidewalls of the molded package body. One or more SMDs are bonded to the package sidewall(s) such that the SMDs are placed in ohmic contact with the leadframe leads exposed through the sidewall(s). In embodiments wherein the SiP includes two or more packages, any combination of package types can be included within the SiP. For example, in many embodiments, the SiP will include at least one FO-WLP and/or at least one Flat No-Lead package. It is also possible to produce embodiments of the SiP to include two or more packages arranged in a side-by-side relationship and interconnected by one or more SMDs disposed therebetween.

In some of the above-described exemplary embodiments, the fabrication method includes the step/process of producing a first package. The first package can include: (i) a first molded package body having a sidewall, (ii) a semiconductor die encapsulated within the first molded package body, and (iii) a first leadframe embedded within the first molded package body and having a first leadframe lead exposed through the sidewall. An SMD can be mounted to the sidewall of the first molded package body such that a first terminal of the SMD is in ohmic contact with the first leadframe lead exposed through the sidewall. In further embodiments, the fabrication method can include the step/process of singulating a first molded panel containing an array of semiconductor die and a leadframe assembly to produce a plurality of singulated packages. Each singulated package can include a molded package body, a semiconductor die embedded within the molded package body, and a leadframe having a peripheral leadframe portion exposed through a sidewall of the molded package body. For each singulated package, at least one terminal of a passive component (e.g., an SMD of the type described above) can be bonded to the peripheral leadframe portion exposed through the sidewall of the molded package body.

Embodiments of a SiP including at least a first package have also been provided. In one embodiment, the first package includes a first molded package body having a sidewall, a semiconductor die encapsulated within the first molded package body, and a first leadframe embedded within the first molded package body and having a first leadframe lead exposed through the sidewall. An SMD is mounted to the sidewall of the first molded package body and having a first terminal ohmically contacting the first leadframe lead exposed through the sidewall of the first molded package body.

The foregoing Detailed Description was merely exemplary in nature and is not intended to limit the invention or the application and uses of the invention. While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes can be made in the function and arrangement of elements described in an exemplary embodiment without departing from the scope of the invention as set-forth in the appended claims.

As appearing in the foregoing description, terms such as "comprise," "include," "have," and the like are intended to cover non-exclusive inclusions, such that a process, method, article, or apparatus that comprises a list of elements is not necessarily limited to those elements, but can include other elements not expressly listed or inherent to such process, method, article, or apparatus. The term "coupled," as appearing herein, is defined as directly or indirectly connected in an electrical or non-electrical manner. As further appearing herein, the term "microelectronic component" is utilized in a broad sense to refer to an electronic device, element, or structure produced on a relatively small scale and amenable to packaging in the below-described manner. Microelectronic components include, but are not limited to, integrated circuits formed on semiconductor die, Microelectromechanical Systems (MEMS) devices, passive electronic components (e.g., a discrete resistor, capacitor, inductor, or diode), optical devices, and other small scale electronic devices capable of providing processing, memory, sensing, radiofrequency, optical, and actuator functionalities, to list but a few examples. The term "System-in-Package" and the corresponding acronym "SiP" are further utilized to refer to a microelectronic package including at least one semiconductor die packaged with at least surface mount device. The term leadframe-based SiP, as appearing herein, referring to SiP containing one or more leadframes, in addition to at least one semiconductor die and one or more SMDs. In this regard, the SMDs included within the below-described SiPs conveniently (but need not always) assume the form of two terminal packages having generally rectangular or square-shaped bodies, such as chip resistors, chip capacitors, and/or chip inductors having opposing end terminals.

What is claimed is:

1. A System-In-Package (SiP), comprising:
a first package comprising:
a first molded package body having a sidewall; and
a first leadframe embedded within the first molded package body, the first leadframe comprising:
a leadframe body; and
a first leadframe lead extending from the leadframe body to the sidewall, the first leadframe lead having a reduced thickness relative to the leadframe body; and
a Surface Mount Device (SMD) mounted to the sidewall of the first molded package body and having a first terminal ohmically contacting the first leadframe lead exposed through the sidewall of the first molded package body.

2. The SiP of claim 1 wherein the SMD is selected from the group consisting of a capacitor, a diode, an inductor, and a resistor.

3. The SiP of claim 1 wherein the first leadframe further comprises a leadframe lead exposed through the sidewall of the first molded package body, and wherein the SMD further has a second terminal ohmically contacting the second leadframe lead exposed through the sidewall.

4. The SiP of claim 3 wherein the SMD is mounted to the sidewall of the first molded package body in a horizontal orientation.

5. The SiP of claim 1 further comprising a second package bonded to the first package in a stacked configuration, the second package comprising:
a second molded package body having a sidewall;
a second leadframe embedded within the second molded package body and having a second leadframe lead exposed through the sidewall;
wherein the SMD is further mounted to the sidewall of the second molded package body and has a second terminal ohmically contacting the second leadframe lead.

6. The SiP of claim 5 wherein the SMD is mounted to the sidewalls of the first and second molded package bodies in a vertical orientation.

7. The SiP claim 6 wherein the SMD comprises a passive microelectronic device having a first electrically-conductive end piece serving as the first terminal and having a second electrically-conductive end piece serving as a second terminal.

8. A System-In-Package (SiP), comprising:
a first package comprising a first leadframe embedded within a first molded package body, the first leadframe having a first leadframe lead extending to a first sidewall of the first molded package body;
a second package bonded to the first package in a stacked configuration, the second package comprising a second leadframe embedded within a second molded package body, the second leadframe having a second leadframe lead extending to a second sidewall of the second molded package body; and
a Surface Mount Device (SMD) having first and second terminals, the SMD mounted to the first and second sidewalls such that the first terminal of the SMD electrically contacts the first leadframe lead and the second terminal of the SMD electrically contacts the second leadframe lead;
wherein the SMD comprises a discrete two terminal inductor providing a known inductance between the first and second leadframe leads.

9. The SiP of claim 8 wherein the first and second terminals of the SMD are soldered to the first and second leadframe leads, respectively.

10. The SiP of claim 8 wherein the first leadframe lead has an exposed face, which is substantially coplanar with the first sidewall of the first molded package body.

11. The SiP of claim 8 wherein the SMD is mounted to the first and second sidewalls in a horizontal orientation.

12. The SiP of claim 8 wherein the first package comprises:
- a semiconductor die embedded in the first molded package body; and
- one or more redistribution layers (RDLs) formed on the first molded package body, the RDLs containing at least one interconnect line electrically coupling the semiconductor die to the first leadframe lead.

13. The SiP of claim 8 wherein the SMD is mounted to the first and second sidewalls in a vertical orientation.

14. The SiP of claim 8 wherein the second package comprises one or more redistribution layers formed on the second molded package body, and wherein the first molded package body is bonded to the one or more redistribution layers.

15. A System-In-Package (SiP), comprising:
- a first molded package body having a sidewall;
- a semiconductor die embedded within the first molded package body;
- a Surface Mount Device (SMD) bonded to the sidewall of the first molded package body and having a first terminal; and
- a leadframe embedded within the first molded package body, the leadframe comprising:
  - a leadframe body; and
  - first and second leadframe leads extending from the leadframe body to the sidewall to electrically contact the first terminal of the SMD.

16. The SiP of claim 15 wherein the SMD is selected from the group consisting of a discrete multiple terminal resistor, a discrete multiple terminal capacitor, and a discrete multiple terminal inductor.

17. The SiP of claim 15 wherein the SMD is bonded to the sidewall of the first molded package body in a horizontal orientation.

18. The SiP of claim 15 wherein the SMD is bonded to the sidewall of the first molded package body in a vertical orientation.

19. The SiP of claim 15 further comprising:
- a first package including the first molded package body, the semiconductor die, and the leadframe; and
- a second package bonded to the first package in a stacked configuration and having a contact point;
- wherein the SMD further includes a second terminal electrically coupled to the contact point of the second package.

20. The SiP of claim 15 wherein the SMD further comprises a second terminal substantially opposite the first terminal, wherein the SiP further comprises a second package bonded to the first molded package body in a stacked configuration, and wherein the second package comprises a third leadframe lead electrically contacting the second terminal of the SMD.

* * * * *